(12) United States Patent
Hiraizumi

(10) Patent No.: US 7,176,097 B2
(45) Date of Patent: Feb. 13, 2007

(54) SEMICONDUCTOR DEVICE AND PROCESS OF FABRICATING SAME

(75) Inventor: Marie Hiraizumi, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/760,463

(22) Filed: Jan. 21, 2004

(65) Prior Publication Data

US 2005/0093083 A1 May 5, 2005

(30) Foreign Application Priority Data

Oct. 31, 2003 (JP) ............................. 2003-371729

(51) Int. Cl.
*H01L 29/76* (2006.01)
*H01L 21/336* (2006.01)

(52) U.S. Cl. .................. 438/305; 438/306; 438/309; 438/199; 438/200; 438/586; 438/592; 438/682; 257/408; 257/344; 257/335

(58) Field of Classification Search ............ 257/408, 257/344, 376, 335, 336, 337; 438/197, 327, 438/586, 589, 268, 227
See application file for complete search history.

(56) References Cited

U.S. PATENT DOCUMENTS 5,489,791 A * 2/1996 Arima et al. .............. 257/336
5,945,710 A * 8/1999 Oda et al. .................. 257/344
6,245,603 B1 * 6/2001 Shinohara .................. 438/197
6,696,729 B2 * 2/2004 Adachi ...................... 257/344

FOREIGN PATENT DOCUMENTS

| JP | 10-189951 | 7/1998 |
| JP | 2000-232075 | 8/2000 |
| JP | 2003-017578 | 1/2003 |

* cited by examiner

*Primary Examiner*—Nathan J. Flynn
*Assistant Examiner*—Fazli Erdem
(74) *Attorney, Agent, or Firm*—VolentineFrancos&Whitt, PLLC

(57) ABSTRACT

A semiconductor device is provided with a FET having a sufficiently small short channel effect and sufficiently small junction capacitance and junction leakage current. The FET includes a channel region formed in a silicon substrate, a gate electrode formed on the channel region through the intermediary of a gate insulting film, heavily doped regions, and pocket regions. The pocket regions are formed to extend from inside the heavily doped regions, respectively, over inside the channel region. Because a pocket sub-region inside the respective heavily doped regions is formed to be located in regions shallower than the respective lower end faces of the heavily doped regions, junction capacitance and junction leakage current are reduced. Further, because respective pocket sub-regions inside the channel region are formed in regions deeper than the respective pocket sub-regions inside the heavily doped regions, a short channel effect can be reduced.

6 Claims, 4 Drawing Sheets

Structure of an embodiment

Structure of an embodiment

Structure of a comparative example

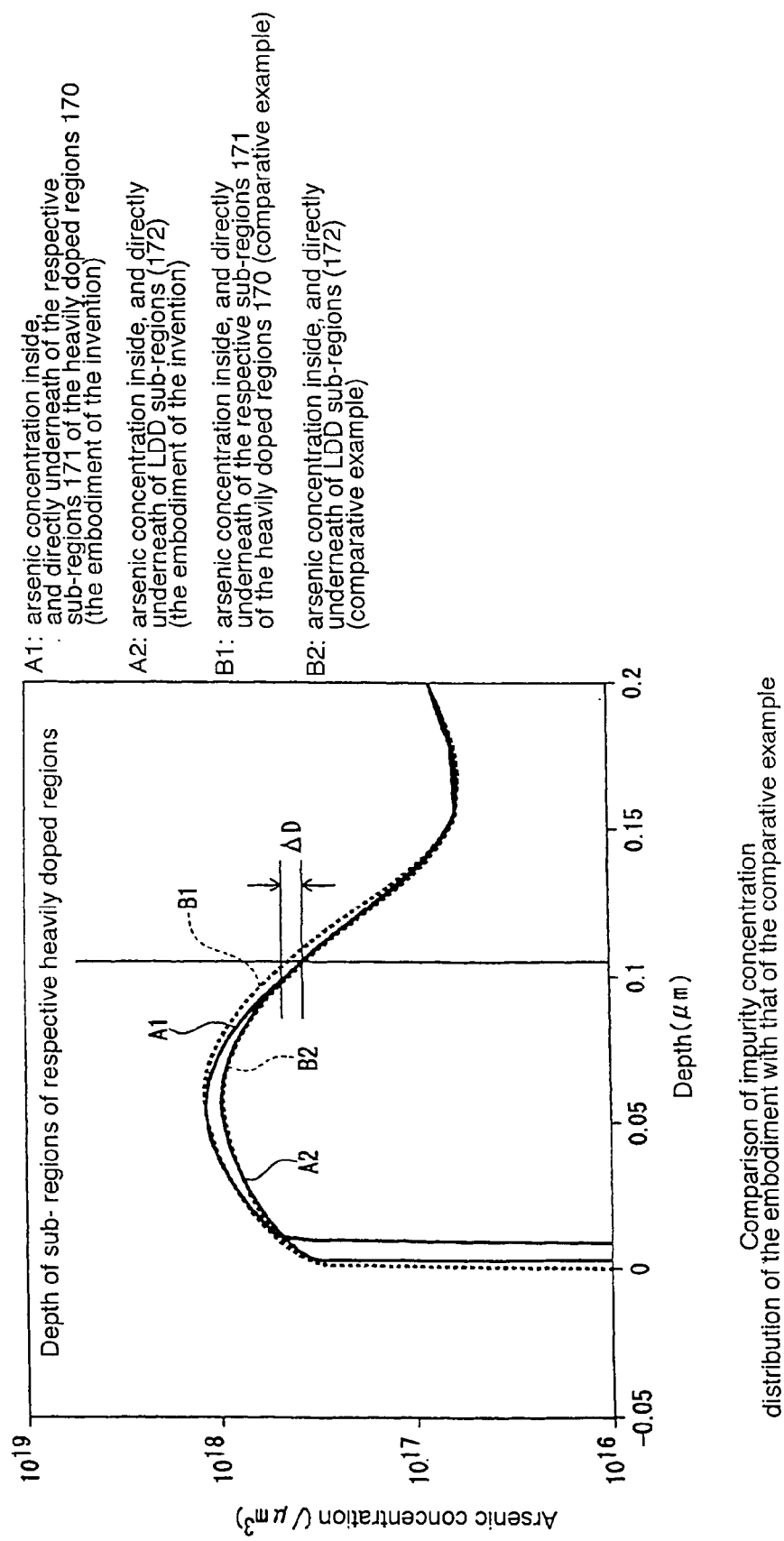

Process of fabrication of embodiment (a first continuation)

Process of fabrication of embodiment (a second continuation)

SEMICONDUCTOR DEVICE AND PROCESS OF FABRICATING SAME

FIELD OF THE INVENTION

The present invention relates to a semiconductor device having a field effect transistor provided with pocket regions, and a process of fabricating the same.

BACKGROUND OF THE INVENTION

As a conventional field effect transistor formed in a semiconductor device, there has been known a field effect transistor provided with pocket regions underneath sidewalls, respectively. The pocket regions are formed so as to have a conductivity type opposite to that for source and drain regions, respectively. A short channel effect of the field effect transistor can be suppressed by providing the same with the pocket regions. As a reference literature concerned with a field effect transistor provided with pocket regions, there are known, for example, the following Patent Documents 1 to 3, namely, JP-A 2003-17578, JP-A 2000-232075 and JP-A 1998-189951.

With the field effect transistor described above, the higher the impurity concentration of the pocket regions, the better an effect for checking the short channel effect is, and the deeper a depth at which the pocket regions are formed, the better the effect for checking the short channel effect is. Furthermore, in order to sufficiently check the short channel effect, it is desirable to form the pocket regions so as to extend up to directly underneath a gate electrode.

Then, in order to increase the impurity concentration of the pocket regions, it is sufficient to increase a dopant dose when forming the pocket regions. However, an increase in the dopant dose will cause a drawback that an increase in junction capacitance between the source and drain regions, respectively, and a substrate, and an increase in junction leak current will result. The reason for this is because the increase in the dopant dose when forming the pocket regions will result in an increase in the impurity concentration in parts of the substrate, in the vicinity of respective lower end faces of the source and drain regions.

In order to prevent the increase in the impurity concentration of the substrate, it is sufficient to form the pocket regions at a depth shallower than the respective lower end faces of the source and drain regions. However, the formation of the pocket regions at shallow depths will decrease the effect for checking the short channel effect.

Further, in order to form the pocket regions so as to extend up to directly underneath the gate electrode, tilted ion implantation has so far been employed, however, in the case of employing the oblique ion implantation when forming the pocket regions, this will cause problems in that there occur regions where no dopant is introduced due to shielding by other gate electrodes adjacent to the gate electrode, and the regions where no dopant is introduced undergo variation in area due to variation in height of the gate electrodes. In order to prevent these problems from affecting the characteristics of the field effect transistor, an ion implantation incident angle is limited to less than on the order of 30 to 40°. As a result, with a method of forming the pocket regions so as to extend up to directly underneath the gate electrode by use of the oblique ion implantation, it has been impossible to sufficiently check the short channel effect.

SUMMARY OF THE INVENTION

In order to resolve those problems described, it is an object of the invention to provide a semiconductor device having a field effect transistor wherein a short channel effect is sufficiently small and junction capacitance as well as junction leak current is sufficiently small, and a process of fabricating the same.

To that end, a semiconductor device according to the invention comprises a semiconductor substrate of a first conductivity type, a gate electrode formed on top of the semiconductor substrate through the intermediary of a gate oxide film, a source and drain, formed in the semiconductor substrate, a source side impurity layer of a first conductivity type formed so as to extend from inside the source to directly underneath the gate electrode, and a drain side impurity layer of the first conductivity type formed so as to extend from inside the drain to directly underneath the gate electrode, wherein the source side impurity layer has a portion thereof directly underneath the gate electrode, formed at a depth deeper from the surface of the semiconductor substrate than a portion thereof inside the source while the drain side impurity layer has a portion thereof directly underneath the gate electrode, formed at a depth deeper from the surface of the semiconductor substrate than a portion thereof inside the drain.

Further, a process of fabricating a semiconductor device according to the invention comprises the steps of forming a semiconductor substrate of a first conductivity type, forming a gate oxide film and a gate electrode on top of the semiconductor substrate, forming a sidewall on both sides of the gate electrode, forming a surface covering film on exposed portions of the surface of the semiconductor substrate, forming a source and drain by introducing a dopant in the semiconductor substrate, removing the sidewalls, and forming a source side impurity layer and drain side impurity layer by introducing a dopant of a first conductivity in the semiconductor substrate through the intermediary of portions of the surface where the sidewalls have been removed, and the surface covering film, wherein the source side impurity layer extends from the source side to directly underneath the gate electrode, and has a portion thereof, formed directly underneath the gate electrode at a depth deeper from the surface of the semiconductor substrate than a depth thereof, inside the source, while the drain side impurity layer extends from the drain side to directly underneath the gate electrode, and has a portion thereof, formed directly underneath the gate electrode at a depth deeper from the surface of the semiconductor substrate than a depth thereof, inside the drain.

With the semiconductor device according to the invention, the source side impurity layer and the drain side impurity layer are formed such that the respective portions thereof, directly underneath the gate electrode, are at the depth deeper from the surface of the semiconductor substrate than the depth of the respective portions thereof, inside the source and drain. Accordingly, it is possible to prevent an increase in junction capacitance and junction leak current while satisfactorily checking a short channel effect.

Furthermore, with the process of fabricating the semiconductor device, according to the invention, the source side impurity layer and the drain side impurity layer are formed by introducing the dopant in the semiconductor substrate through the intermediary of the portions of the surface where the sidewalls have been removed, and the surface covering film, so that the respective portions of the source side impurity layer and the drain side impurity layer, directly underneath the gate electrode, are at the depth deeper from the surface of the semiconductor substrate than the depth of the respective portions thereof, inside the source and drain. In addition, with the process of fabricating the semiconductor device, according to the invention, the semiconductor device according to the invention can be inexpensively formed by use of simple process steps.

BRIEF DESCRIPTION OF THE DRAWINGS

FIG. 3 is a graph showing comparison of impurity concentration distribution of the field effect transistor according to the present embodiment against that of the field effect transistor for comparative purposes;

PREFERRED EMBODIMENT OF THE INVENTION

A preferred embodiment of the invention is described hereinafter with reference to the accompanying drawings. It is to be pointed out that respective constituents in figures are only broadly shown in respect of size, shape, and disposition relation to the extent that the invention can be understood, and conditions based on numerical values as described hereinafter are given only by way of example.

Figure 1:
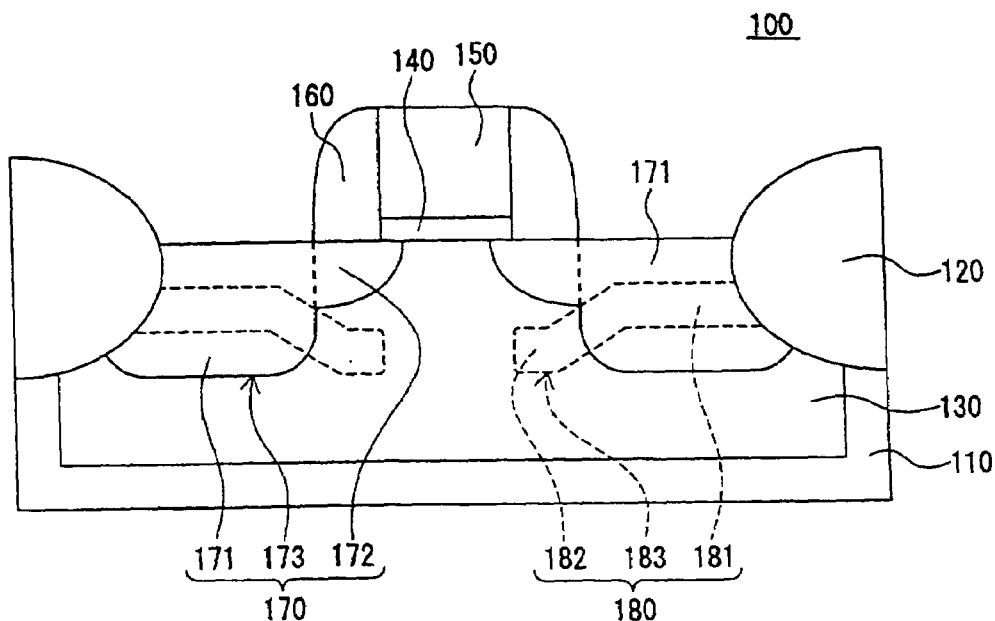
FIG. 1 is a sectional view broadly showing the structure of a field effect transistor in a semiconductor device according to an embodiment of the invention.

FIG. 1 is a sectional view broadly showing the structure of a MOSFET (Metal-Oxide-Semiconductor Field Effect Transistor) 100 provided in a semiconductor device according to the present embodiment of the invention.

As shown in FIG. 1, with the MOSFET 100, there are formed a field oxide film 120, a channel region 130, a gate oxide film 140, a gate electrode 150, sidewalls 160, heavily doped regions (source and drain regions) 170, and pocket regions 180, on top of a silicon substrate 110.

The field oxide film 120 is an isolation film, that is, a film for electrically isolating an element-forming region from other regions, respectively, and is formed in such a way as to cover the periphery of the element-forming region.

The channel region 130 is formed by introducing a dopant in low concentration into the element-forming regions in whole of the semiconductor substrate 110. In the case of an n-channel type MOSFET, for example, boron or $BF_2$ is used as the dopant for the channel region 130, and in the case of a p-channel type MOSFET, for example, arsenic or phosphorus is used as the dopant for the channel region 130.

The gate oxide film 140 is a thin insulating film for insulation between the channel region 130 and the gate electrode 150.

The gate electrode 150 is formed of an electrically conductive material, such as, for example, polysilicon, and so forth, on top of the gate oxide film 140. When forming the gate electrode 150 of polysilicon, phosphorus or arsenic may be used as a dopant in the case of the n-channel type MOSFET while boron or $BF_2$ may be used in the case of the p-channel type MOSFET. At this time, impurity concentration may be on the order of, for example, $2\times10^{15}$ $cm^{-3}$.

The sidewalls 160 are formed on the sides of the gate oxide film 140 as well as the gate electrode 150, respectively.

The heavily doped regions 170 are regions to serve as the source and drain regions of the MOSFET 100, respectively.

The heavily doped regions 170 are disposed so as to be opposed to each other with the gate electrode 150 interposed therebetween. The respective heavily doped regions 170 comprise a sub-region 171 formed down to a large depth in the channel region 130, and a shallow LDD (Lightly Doped Drain) sub-region 172 formed directly underneath the respective sidewalls 160. As is well known, the heavily doped regions 170 use arsenic or phosphorus as a dopant in the case of the n-channel type MOSFET to be thereby formed to have a p-type while using boron or $BF_2$ as a dopant in the case of the p-channel type MOSFET to be thereby formed to have an n-type.

The pocket regions 180 are formed so as to extend from inside the heavily doped regions 170, respectively, over inside the channel region 130. The pocket regions 180 have the same conductivity type as a conductivity type of the channel region 130, that is, a conductivity type opposite to that of the heavily doped regions 170.

Herein, a pocket sub-region 181 inside the respective heavily doped regions 170 is formed so as to be located in regions shallower than the respective lower end faces 173 of the heavily doped regions 170. As a result, impurity contained in the respective pocket regions 180 can be prevented from reaching the respective lower end faces 173 of the heavily doped regions 170, or can be reduced in an amount reaching the respective lower end faces 173. As described above, both the channel region 130 and the pocket regions 180 have the same conductivity type. Accordingly, if the respective pocket regions 180 are formed so as to overlap the respective lower end faces 173 of the heavily doped regions 170, this will cause impurity concentration of the channel region 130, in the vicinity of interfaces between the channel region 130 and the respective lower end faces 173, to become higher. If impurity concentration in such parts as described increases, junction capacitance between the respective heavily doped regions 170 and the channel region 130 as well as junction leak current will increase in those parts. In contrast, with the present embodiment, the respective pocket regions 180 are formed so as to be located in the region shallower than the respective lower end faces 173 of the heavily doped regions 170, so that it is possible to hold down the impurity concentration of the channel region 130, in the vicinity of the interfaces between the channel region 130 and the respective lower end faces 173, to a low level. An area of the respective interfaces between the respective lower end faces 173 of the heavily doped regions 170 and the channel region 130 generally accounts for about 90% of an total area of respective interfaces between the respective heavily doped regions 170 and the channel region 130. Hence, with the present embodiment, the junction capacitance and junction leak current can be sufficiently reduced.

Figure 2:
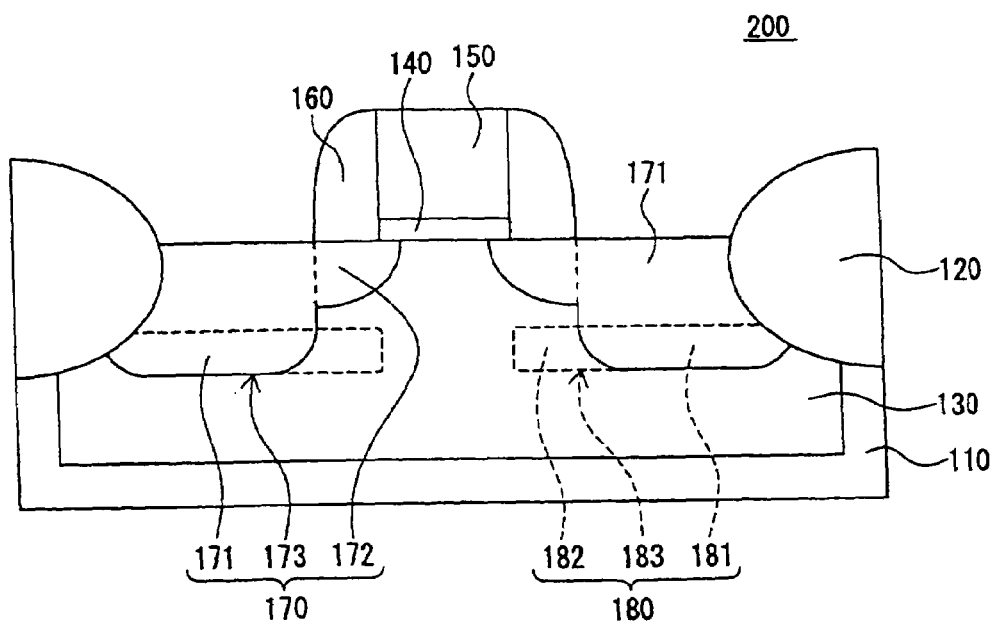
FIG. 2 is a sectional view broadly showing the structure of a field effect transistor for comparative purposes.

FIG. 2 is a sectional view broadly showing the structure of a MOSFET 200 for comparative purposes. The MOSFET 200 shown in FIG. 2 differs from the MOSFET 100 according to the present embodiment in that respective pocket regions 180 are formed so as to overlap respective lower end faces 173 of heavily doped regions 170 (refer to FIG. 1). FIG. 3 is a graph showing comparison of impurity concentration distribution of the MOSFET 100 according to the present embodiment with that of the MOSFET 200 for comparative purposes. In FIG. 3, the vertical axis indicates impurity concentration (in this case, a dopant is arsenic) and the horizontal axis indicates depth. As is evident from FIG. 3, since in the case of the MOSFET 100 according to the present embodiment, the respective pocket regions 180 are formed so as not to overlap the respective lower end faces 173 of the heavily doped regions 170, arsenic concentration (refer to symbol A1 in FIG. 3) at the respective lower end faces 173 is lower by ΔD than arsenic concentration (refer to symbol B1 in FIG. 3) at the respective lower end faces 173 of the MOSFET 200 for comparative purposes.

Further, with the present embodiment, respective pocket sub-regions 182 inside the channel region 130 are formed in regions deeper than the respective pocket sub-regions 181 inside the heavily doped regions 170. As described previously, the deeper positions where the pocket regions are formed, the less a short channel effect becomes. Accordingly, with the present embodiment, the short channel effect can be reduced. Respective lower end faces 183 of the pocket sub-regions 182 inside the channel region 130 are preferably formed at the same depth as or at a depth deeper than a depth of the respective lower end faces 173 of the heavily doped regions 170. By so doing, the pocket sub-regions 182 inside the channel region 130 will be formed at depths sufficiently deep, so that the short channel effect can be checked so as to be satisfactorily small.

It is desirable that respective pocket sub-regions 182 inside the channel region 130 are formed to extend up to directly underneath the gate electrode 150. As mentioned above, the formation of the pocket regions 180 to extend up to directly underneath the gate electrode 150 reduces the short channel effect.

Now, a process of fabricating the MOSFET 100 shown in FIG. 1 is described with reference to FIGS. 4(A) to 4(C) and 5(A) to 5(C).

First, the field oxide film 120 is formed on top of the silicon substrate 110 by thermal oxidation, and so forth. Further, dopant ions are implanted into the surface of the silicon substrate 110, thereby forming the channel region 130. As described above, for a channel dopant, for example, boron or $BF_2$ is used in the case of fabricating the n-channel type MOSFET, and, for example, arsenic or phosphorus in the case of fabricating the p-channel type MOSFET.

Subsequently, an insulating thin film 401 is formed on the surface of the silicon substrate 110. For the insulating thin film 401, for example, a CVD (Chemical Vapor Deposition) oxide film formed of silicon can be used. The insulating thin film 401 is formed to a thickness, for example, 2 nm. Then, an electrically conductive film 402 such as a polysilicon film, and so forth is formed on top of the insulating thin film 401 by, for example, the CVD process {refer to FIG. 4(A)}. As described previously, for a gate dopant, arsenic or phosphorus in concentration on the order of, for example, $2 \times 10^{15}$ cm$^{-3}$ may be introduced in the case of the n-channel type MOSFET while boron or $BF_2$ in concentration on the order of, for example, $2 \times 10^{15}$ cm$^{-3}$ may be introduced in the case of the p-channel type MOSFET. The electrically conductive film 402 is formed to a thickness, for example, 100 to 200 nm.

Thereafter, by normal photolithographic techniques, the insulating thin film 401 and the electrically conductive film 402 are patterned, thereby forming the gate oxide film 140, and the gate electrode 150.

Figure 4A:
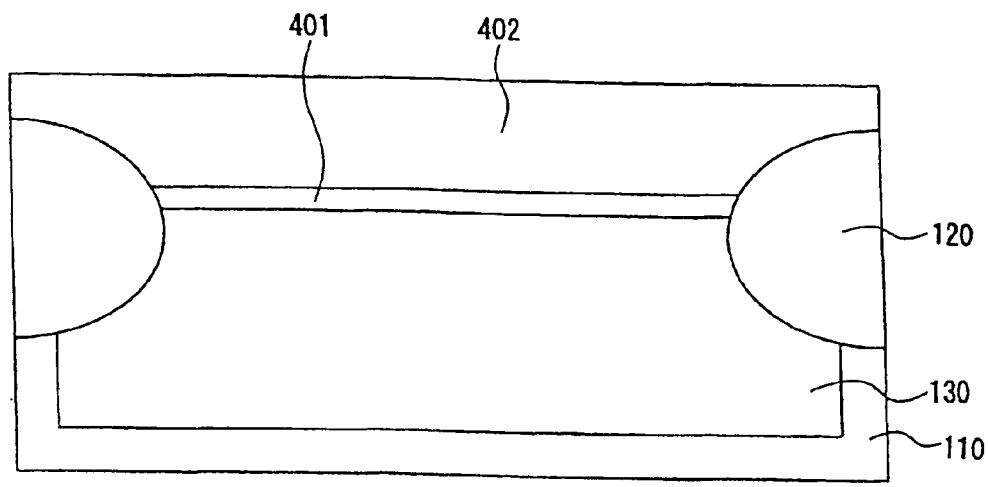
FIGS. 4(A) to 4(C) are sectional views showing a process of fabricating the field effect transistor according to the present embodiment.
Figure 4B:
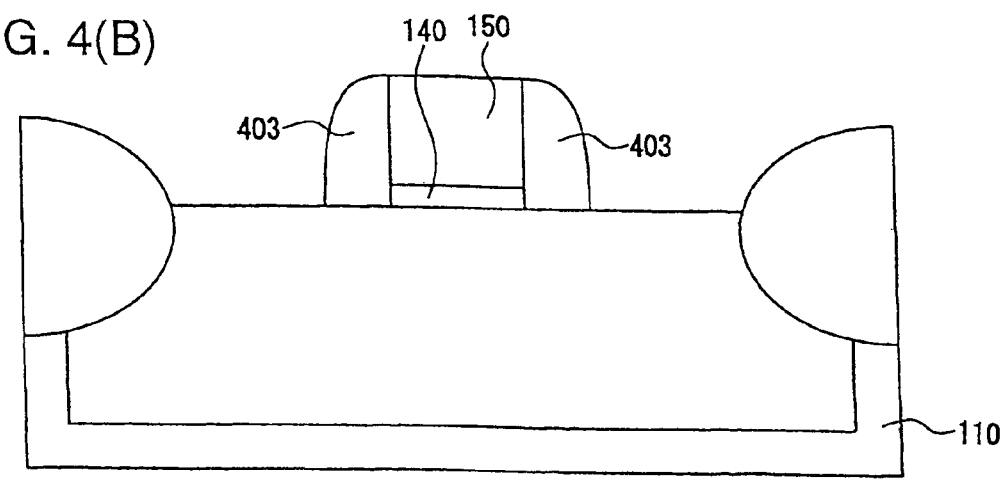

Subsequently, sidewalls 403 serving as masks are formed on the sides of the gate oxide film 140 as well as the gate electrode 150, respectively {refer to FIG. 4(B)}. For the sidewalls 403, use can be made of, for example, a laminated film consisting of a silicon oxide film and a silicon nitride film. The sidewalls 403 of such a laminate structure as described can be formed by first forming a thin silicon oxide film throughout the surface of the substrate 110 by applying, for example, oxidation treatment, and subsequently, by forming a silicon nitride film by use of the CVD process, and so forth, followed by etching back of the laminated film made up of those films.

Figure 4C:
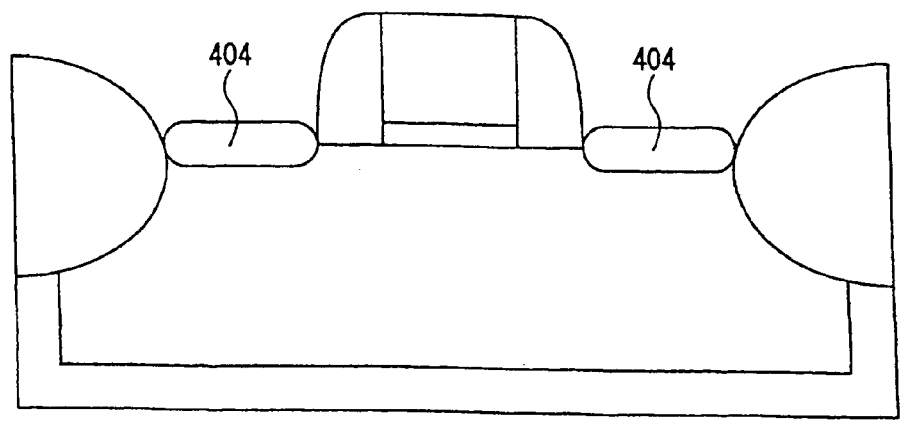

Next, an oxide film 404 (a surface covering film according to the invention) is formed on exposed portions of the surface of the channel region 130 {refer to FIG. 4(C)}. Oxidation treatment at this time is preferably applied at a temperature as low as possible and for a period of time as short as possible. The reason for this is because it is necessary to inhibit redistribution of impurities occurring following the oxidation treatment. A film thickness of the oxide film 404 is on the order of, for example, 20 nm, however, the film thickness is to be decided upon after taking into account a relationship thereof with conditions of ion implantation in the step of forming the pocket regions at a later stage (described later). Thus, because the oxide film 404 is formed in a self-aligned manner, there is no risk of misalignment, and so forth, so that the position thereof can be controlled with high precision.

Figure 5A:
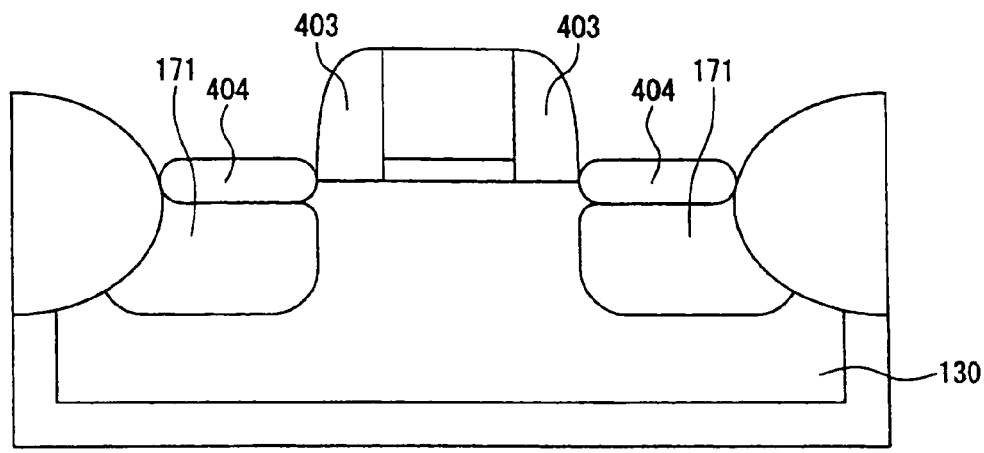
FIGS. 5(A) to 5(C) are sectional views showing the process of fabricating the field effect transistor according to the present embodiment.
Figure 5B:
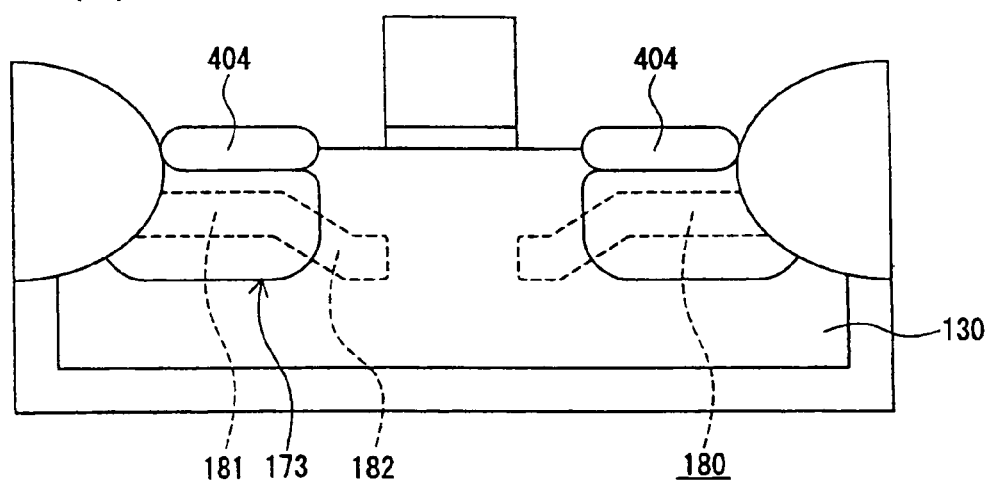
Figure 5C:
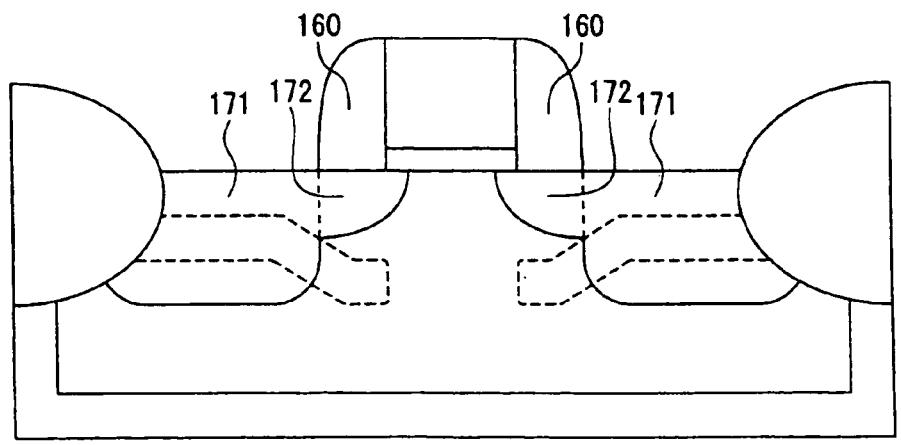

Thereafter, dopant ions of a conductivity type opposite to that for the channel region 130 are implanted into the channel region 130 through the intermediary of the oxide film 404, thereby forming the respective sub-regions 171 at a large depth inside the heavily doped regions 170 {refer to FIG. 5(A)}. The conditions of the ion implantation at this time are decided upon depending on the film thickness of the oxide film 404. For example, if the film thickness of the oxide film 404 is 20 nm, transistor characteristics equivalent to that for the conventional case can be expected by increasing ion implantation energies by the order of 5 to 15 eV over that in the case where the oxide film 404 is non-existent.

Subsequently, the sidewalls 403 are removed, whereupon portions of the channel region 130, in regions where the sidewalls 403 existed before, are exposed. Thereafter, dopant ions of the same conductivity type as a conductivity type for the channel region 130 are implanted into the channel region 130, thereby forming the pocket regions 180 {refer to FIG. 5(B)}. Conditions of the ion implantation at this time are decided upon depending on the film thickness of the oxide film 404. That is, the conditions of the ion implantation are decided upon such that the pocket sub-region 181 is formed so as to be located in the regions shallower than the respective lower end faces 173 of the heavily doped regions 170. At this point in time, the oxide film 404 has not been formed in the regions where the respective pocket sub-regions 182 are to be formed, so that the respective pocket sub-regions 182 have a depth deeper than that of the respective pocket sub-regions 181. Further, by setting the film thickness of the oxide film 404 and the conditions of the ion implantation as appropriate, it is possible to form the respective pocket sub-regions 181 in the regions shallower than the respective lower end faces 173, and to form the respective pocket sub-regions 182 in regions at a depth equivalent to or deeper than the depth of the respective lower end faces 173. As described in the foregoing, the deeper the respective positions where the pocket sub-regions 182 are formed, the larger the effect of checking the short channel effect becomes. Further, oblique ion implantation may be executed as the ion implantation at this point in time. Even if the oblique ion implantation is not executed, advantageous effects of the invention can be obtained. However, with the oblique ion implantation adopted, magnitude of the short channel effect as checked can be further increased (as previously described). As with the conventional MOSFET, an ion implantation incident angle is preferably on the order of 30 to 40° in order to inhibit variation in the characteristics of a field effect transistor.

After removal of the oxide film 404, dopant ions of a conductivity type opposite to the conductivity type for the channel region 130 are implanted into the channel region 130, thereby the shallow LDD sub-regions 172. Thus, with the process of fabricating the MOSFET 100 according to the invention, the LDD sub-regions 172 are formed after removal of the oxide film 404. Upon the formation and removal of the oxide film 404, the surface of the substrate 110 is shaved. Accordingly, if the LDD sub-regions 172 are formed prior to the formation of the oxide film 404, or prior to the removal thereof after the formation, the formation or the removal of the oxide film 404 will cause a junction depth in respective interface regions between the LDD sub-regions 172 and the sub-regions 171 formed down to the large depth to be shallower, thereby raising the risk of increasing resistance in the respective interface regions. In contrast, with the present embodiment, since the LDD sub-regions 172 are to be formed after removal of the oxide film 404, there occurs no increase in the resistance in the respective interface regions.

Finally, the respective sidewalls 160 may be formed as necessary. The respective sidewalls 160 each are formed by forming a silicon oxide film with the use of, for example, the CVD process, followed by etching back the silicon oxide film {refer to FIG. 5(B)}.

As described hereinbefore, the invention can provide the semiconductor device provided with the field effect transistor provided having a sufficiently small short channel effect as well as sufficiently small junction capacitance, and junction leak current.

In addition, the invention can provide the process of fabricating the semiconductor device inexpensively, comprising simple steps.

What is claimed is:

1. A process of fabricating a semiconductor device comprising:
   forming a semiconductor substrate of a first conductivity type, the semiconductor substrate having a surface;
   forming a gate oxide film and a gate electrode on the surface of the semiconductor substrate;
   forming a sidewall on both sides of the gate electrode;
   forming a surface covering film on exposed portions of the surface of the semiconductor substrate;
   forming a source and a drain beneath the surface covering film by introducing a dopant of a second conductivity type into the semiconductor substrate through the surface covering film, wherein the source and the drain have a first depth from the surface of the semiconductor substrate;
   removing the sidewalls so as to expose the surface of the semiconductor substrate near the gate electrode; and
   forming a source side impurity layer and a drain side impurity layer by introducing a dopant of the first conductivity type into the semiconductor substrate through the surface covering film and into the exposed surface of the semiconductor substrate near the gate electrode,
   wherein the source side impurity layer extends from inside the source at a second depth that is shallower than the first depth, to directly underneath the gate electrode at a third depth that is equal to or deeper than the first depth, and
   wherein the drain side impurity layer extends from the drain at the second depth to directly underneath the gate electrode at the third depth.

2. A process of fabricating a semiconductor device according to claim 1, further comprising forming LDD regions of the second conductivity type, in a vicinity of the gate electrode, and in respective regions directly above the source side impurity layer and the drain side impurity layer.

3. A process of fabricating a semiconductor device according to claim 2, further comprising forming second sidewalls covering both sides of the gate oxide film and the gate electrode, respectively, on top of the LDD regions.

4. A process of fabricating a semiconductor device according to claim 1, wherein said forming a source side impurity layer and a drain side impurity layer is conducted by an oblique ion implantation, so that the source side impurity layer and the drain side impurity layer extend up to regions directly underneath the gate electrode, respectively.

5. A process of fabricating a semiconductor device according to claim 1, wherein the surface covering film is formed by oxidizing the surface of the semiconductor substrate.

6. A process of fabricating a semiconductor device according to claim 4, wherein an angle of the oblique ion implantation is in a range of about 30 to 40 degrees.

* * * * *